United States Patent
Chun et al.

(10) Patent No.: US 9,088,445 B2
(45) Date of Patent: Jul. 21, 2015

(54) METHOD AND APPARATUS FOR SELECTIVELY TERMINATING SIGNALS ON A BIDIRECTIONAL BUS BASED ON BUS SPEED

(71) Applicant: QUALCOMM Incorporated, San Diego, CA (US)

(72) Inventors: Dexter T. Chun, San Diego, CA (US);
Sumeet S. Sethi, San Diego, CA (US);
John D. Eaton, San Diego, CA (US);
Vinodh R. Cuppu, Oceanside, CA (US);
Vikram Arora, Raleigh, NC (US);
Vaishnav Srinivas, San Diego, CA (US);
Asim Muhammad Muneer, San Diego, CA (US); Isaac D. Berk, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 139 days.

(21) Appl. No.: 13/787,926

(22) Filed: Mar. 7, 2013

(65) Prior Publication Data

US 2014/0253173 A1 Sep. 11, 2014

(51) Int. Cl.
*H03K 17/16* (2006.01)
*H04L 25/02* (2006.01)
*G06F 13/40* (2006.01)
*H03K 19/00* (2006.01)

(52) U.S. Cl.
CPC ........ *H04L 25/0278* (2013.01); *G06F 13/4086* (2013.01); *H03K 19/0005* (2013.01)

(58) Field of Classification Search
CPC .............. H04L 25/028; H04L 25/0298; H04L 25/0278; H03K 19/0005; G06F 13/4086
USPC ............................. 326/30, 63, 68, 80–83, 86
See application file for complete search history.

(56) References Cited

U.S. PATENT DOCUMENTS

| | | | |
|---|---|---|---|
| 5,467,455 A | 11/1995 | Gay | |
| 6,664,804 B2 * | 12/2003 | Nakada et al. | 326/21 |
| 6,721,212 B2 * | 4/2004 | Sasaki | 365/189.11 |
| 6,801,969 B2 * | 10/2004 | Crafts et al. | 710/100 |
| 6,894,691 B2 | 5/2005 | Juenger | |
| 7,173,450 B2 | 2/2007 | Atkinson | |
| 7,612,578 B2 * | 11/2009 | Chang et al. | 326/30 |
| 7,746,098 B2 | 6/2010 | Heath et al. | |

(Continued)

OTHER PUBLICATIONS

International Search Report and Written Opinion—PCT/US2014/021401—ISA/EPO—Aug. 6, 2014.

*Primary Examiner* — Jason M Crawford
(74) *Attorney, Agent, or Firm* — Muncy, Geissler, Olds & Lowe, P.C.

(57) ABSTRACT

A method of controlling signal termination includes providing first logic for selectively terminating signals received at a first device on a bidirectional data bus, providing second logic for selectively terminating signals received at a second device on the bidirectional data bus, sending first signals from the first device to the second device on the bidirectional data bus at a first speed, stopping the sending of the first signals, after stopping the sending of the first signals, enabling the second logic and shifting a reference voltage of the second device from a first level to a second level, after enabling the second logic at the second device, sending second signals from the first device to the second device on the bidirectional data bus at a higher speed, and controlling the first logic based on a speed of signals received at the first device on the bidirectional data bus.

27 Claims, 4 Drawing Sheets

(56) References Cited

U.S. PATENT DOCUMENTS

| | | |
|---|---|---|
| 7,864,183 B1 | 1/2011 | Lam et al. |
| 7,868,650 B2 | 1/2011 | Kim |
| 8,619,492 B2 * | 12/2013 | Jeon .......................... 365/233.16 |
| 2006/0091900 A1 | 5/2006 | Kang et al. |
| 2008/0112233 A1 | 5/2008 | Woo et al. |
| 2010/0118635 A1 * | 5/2010 | Bae et al. ....................... 365/219 |
| 2010/0142297 A1 * | 6/2010 | Lee et al. ....................... 365/198 |
| 2011/0316580 A1 | 12/2011 | Mccall et al. |

\* cited by examiner

METHOD AND APPARATUS FOR SELECTIVELY TERMINATING SIGNALS ON A BIDIRECTIONAL BUS BASED ON BUS SPEED

FIELD OF THE DISCLOSURE

The present disclosure is directed to a method and apparatus for selectively terminating signals at each end of a bidirectional data bus, and, more specifically, toward a method and apparatus for controlling signal terminations and reference voltages at each end of a bidirectional data bus and for controlling transmission speed on the bidirectional data bus.

BACKGROUND

Electronic devices include various pathways on which data must be transferred at high speed. One example of a high-speed data pathway is a data bus between a processor and a memory device. When signaling rates are high, it is generally necessary to use impedance matching signal terminations on pathways to control artifacts such as electrical reflections, inter-symbol interference, overshoot, undershoot, and ringing. Terminations consume significant electrical power, however, and are therefore not used when signal rates are low enough to avoid the foregoing artifacts.

Devices that use high signal rates and thus require signal termination have heretofore often been AC line powered or contained a sufficiently large battery pack (a laptop, for example) so that the power drain of signal termination circuitry could be ignored. In addition, many electronic components, memory devices such as dynamic random access memory (DRAM) device, for example, contain built-in features like on-die termination (ODT) which selectively terminate signals based on the direction that a signal is travelling. That is, control circuitry on the DRAM device itself selectively enables signal termination during signal reception and disables it at other times.

Manufacturers continue to look for ways to decrease power use, both to prolong battery life and to reduce the amount of heat that must be dissipated. It would therefore be desirable to provide a system and method for dynamically controlling signal termination that reduces energy use.

SUMMARY

Exemplary embodiments of the invention are described below. A first exemplary embodiment comprises a method of controlling signal termination on at least one bus connecting a first device to a second device. The method includes connecting the first device to the second device by a bidirectional data bus, providing first termination logic for selectively terminating signals received at the first device on the bidirectional data bus, and providing second termination logic for selectively terminating signals received at the second device on the bidirectional data bus. The method also includes sending first signals from the first device to the second device on the bidirectional data bus at a first speed, stopping the sending of the first signals, and, after stopping the sending of the first signals, enabling the second termination logic and shifting a reference voltage of the second device from a first level to a second level. The method further includes, after enabling the second termination logic at the second device, sending second signals from the first device to the second device on the bidirectional data bus at a second speed, greater than the first speed, and controlling the first termination logic based on a speed of signals received at the first device on the bidirectional data bus.

Another exemplary embodiment includes a system that has a memory interface and a memory device connected to the memory interface by a control bus and by a bidirectional data bus. The system includes first termination logic for selectively terminating signals received at the memory interface on the bidirectional data bus, second termination logic for selectively terminating signals received at the memory device on the bidirectional data bus, and third termination logic for selectively terminating signals received at the memory device on the control bus. The system has a reference voltage generator for providing a first reference voltage to the memory interface and for providing a second reference voltage to the memory device and a controller for selectively enabling the first termination logic and the second termination logic and the third termination logic and for controlling the first and second reference voltages output by the reference voltage generator. The controller also controls data transmission between the memory interface and the memory device on the bidirectional data bus and is configured to selectively enable the first termination logic based on a speed of signals received at the memory interface on the bidirectional data bus and to selectively enable the second termination logic based on a speed of signals received at the memory device on the bidirectional data bus and to selectively enable the third termination logic based on a speed of signals received at the memory device on the control bus. The controller also causes the reference voltage generator to provide a first reference voltage to the memory interface when the first termination logic is enabled and to provide a second reference voltage different than the first reference voltage to the memory interface when the first termination logic is not enabled and to provide a third reference voltage to the memory device When the third termination logic is enabled and to provide a fourth reference voltage different than the third reference voltage to the memory device when the third termination logic is not enabled. The controller is also configured to stop traffic on the bidirectional data bus before enabling or disabling the first termination logic and before enabling or disabling the second termination logic.

A further exemplary embodiment includes a system having a bidirectional data bus connecting a first device to a second device, first termination means for selectively terminating signals received at the first device on the bidirectional data bus and second termination means for selectively terminating signals received at the second device on the bidirectional data bus. The system also includes means for sending first signals from the first device to the second device on the bidirectional data bus at a first speed and means for stopping the sending of the first signals, and includes means for enabling the second termination means and for shifting a reference voltage of the second device from a first level to a second level after stopping the sending of the first signals. The system also includes means for sending second signals from the first device to the second device on the bidirectional data bus at a second speed, greater than the first speed, after enabling the second termination means at the second device, and means for controlling the first termination means based on a speed of signals received at the first device on the bidirectional data bus.

Another exemplary embodiment comprises a method of controlling signal termination on at least one bus connecting a first device to a second device that includes steps for connecting the first device to the second device by a bidirectional data bus, steps for providing first termination logic for selectively terminating signals received at the first device on the bidirectional data bus, and steps for providing second termination logic for selectively terminating signals received at the second device on the bidirectional data bus. The method also includes steps for sending first signals from the first device to the second device on the bidirectional data bus at a first speed, steps for stopping the sending of the first signals, and, after stopping the sending of the first signals, steps for enabling the second termination logic and shifting a reference voltage of the second device from a first level to a second level. The method also includes, after enabling the second termination logic at the second device, steps for sending second signals from the first device to the second device on the bidirectional data bus at a second speed, greater than the first speed, and steps for controlling the first termination logic based on a speed of signals received at the first device on the bidirectional data bus.

Another exemplary embodiment comprises a non-transitory computer readable medium embodying instructions that, when executed by a computer, cause the computer to control signal terminations on at least one bus connecting a first device to a second device by selectively terminating signals received at the first device on the bidirectional data bus, and selectively terminating signals received at the second device on the bidirectional data bus. The instructions are also for causing the first device to send first signals from the first device to the second device on the bidirectional data bus at a first speed, for causing the first device to stop the sending of the first signals, and after causing the first device to stop the sending of the first signals, shifting a reference voltage of the second device from a first level to a second level. The instructions are also for, after enabling the second termination logic at the second device, causing the first device to send signals from the first device to the second device on the bidirectional data bus at a second speed, greater than the first speed, and controlling the first termination logic based on a speed of signals received at the first device on the bidirectional data bus.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
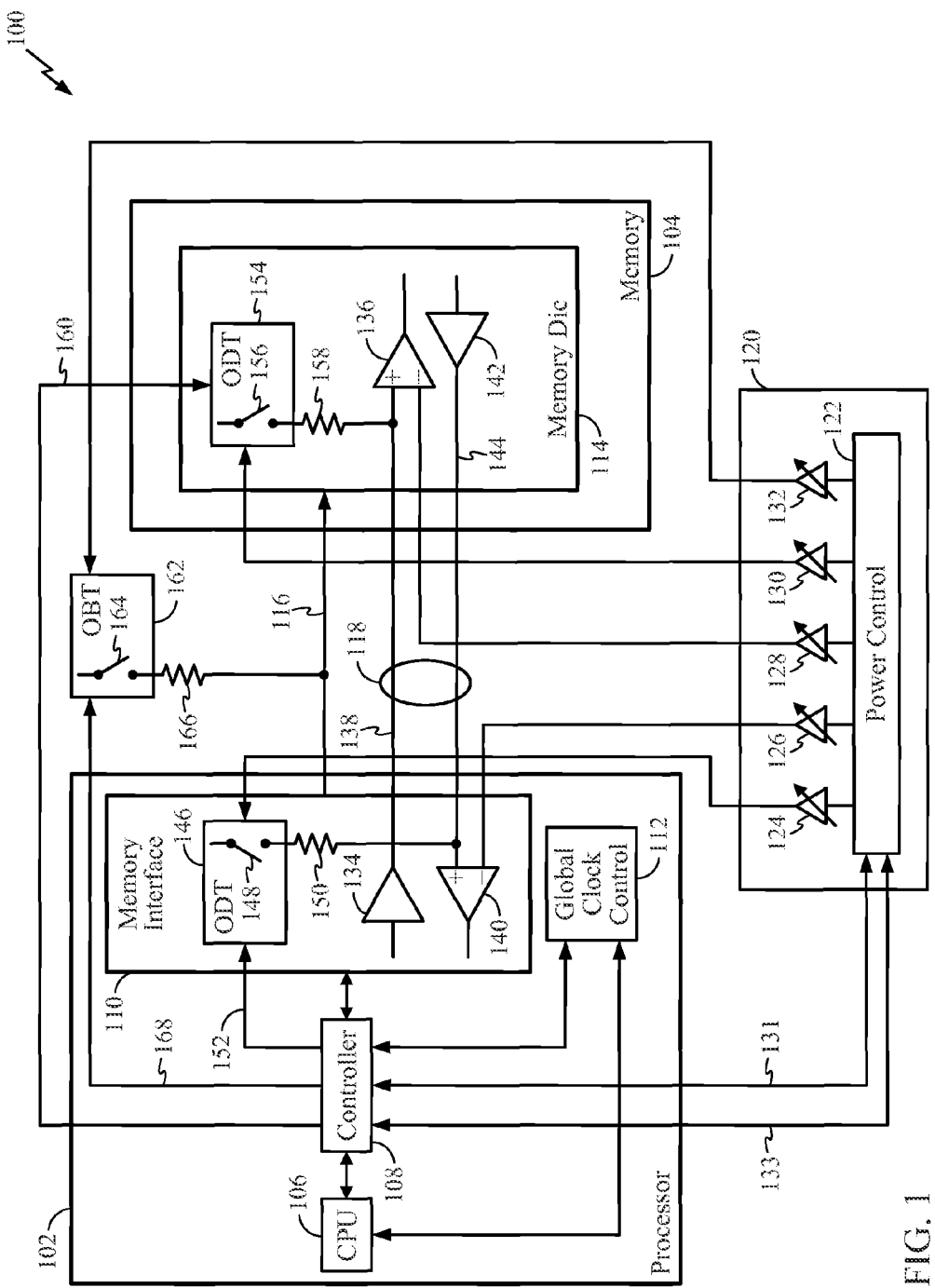
FIG. 1 is a circuit diagram illustrating a system including a processor and a memory device according to an embodiment of the disclosure.

FIG. 1 schematically illustrates a system 100 comprising a processor 102 and a memory device 104. The processor 102 includes a central processing unit (CPU) 106, a controller 108, which may comprise, for example, a finite state machine, a memory interface 110 and a global clock control 112. While the foregoing elements relate to the present disclosure, the processor 102 may constitute a system-on-chip (SOC) and include other conventional elements (not illustrated) necessary for the processor 102 to operate. The memory device 104 includes at least one memory die 114, and the memory interface 110 communicates with the memory die 114 via a control bus 116 and a bidirectional data bus 118. The memory interface 110 is responsible for managing communication between the processor 102 and the memory device 104. The system 100 also includes a power system 120 including a power controller 122 and a plurality of regulators including a first regulator 124, a second regulator 126, a third regulator 128, a fourth regulator 130 and a fifth regulator 132 that together form a reference voltage generator and which, in some embodiments, may comprise an active buffer with a high impedance ladder. The processor 102 communicates with the power controller 122 via a serial data bus 131 and a serial clock bus 133.

The memory interface 110 includes a driver 134 connected to a receiver 136 on the memory die 114 by a first data line 138, and the memory interface 110 includes a receiver 140 connected to a driver 142 on the memory die 114 by a second data line 144. The first and second data lines 138, 144 represent logical portions of the bidirectional data bus 118 rather than discrete interconnections and are illustrated separately for ease of description only.

The memory interface 110 includes on-die termination (ODT) logic 146 that controls a switch 148 for selectively connecting a resistor 150 to the first regulator 124 of the power system 120. The switch 148 is controlled by the ODT logic 146 and by the controller 108 which is connected to the ODT logic 146 by a line 152. When the switch 148 is closed, a resistance is connected to the receiver 140 in the memory interface 110 to terminate the second data line 144 and reduce artifacts that may be produced when signals are transmitted on the second data line 144 of the bidirectional data bus 118 at a high speed. The memory die 114 also includes ODT logic 154 that controls a switch 156 for selectively connecting a resistor 158 to the fourth regulator 130 of the power system 120. The switch 156 in the memory die 114 is controlled by the ODT logic 154 and by the controller 108 of the processor 102 which is connected to the switch 156 on the memory die 114 by a line 160. When the switch 156 is closed, a resistance is connected to the receiver 136 in the memory die 114 to terminate the first data line 138 and reduce artifacts that may be produced when signals are transmitted on the first data line 138 of the bidirectional data bus 118 at a high speed. The system 100 also includes on-board termination (OBT) logic 162 that controls a switch 164 for selectively connecting a resistor 166 to the control bus 116 for selectively connecting the control bus 116 to the fifth regulator 132 of the power system 120. The controller 108 and the OBT logic 162 control the state of the switch 164, and the controller 108 is connected to the OBT logic 162 by a line 168. When the switch 164 is closed, a resistance is connected to the control bus 116 to terminate the control bus 116 and reduce artifacts that may be produced when signals are transmitted on the control bus 116 at a high speed.

One input of the receiver 140 in the memory interface 110 is connected to the second regulator 126 of the power system 120, and one input of the receiver 136 in the memory die 114 is connected to the third regulator 128 of the power system 120. The second regulator 126 and the third regulator 128 provide appropriate reference voltages to the memory interface receiver 140 and the memory die receiver 136 which reference voltages are selected based on the speed that data is being transmitted on the bidirectional data bus 118.

The operation of the system 100 will now be described. The system 100 will be described herein as operating at "low," "medium" and "high" data rates. Without specifically defining these data rates, a "low" data rate is a rate at which data can be efficiently transferred in a system without the use of signal termination and a "high" data rate is a rate at which signal termination is necessary or desirable. A medium rate as used herein is a rate high enough that termination of the bidirectional data bus 118 is desirable but low enough that termination of the control bus 116 is not necessary. In a typical system such as a DDR3 DRAM, a low data rate might be anything below 400 MHz (800 Mbps), a medium data rate between 400 and 667 MHz, and a high data rate anything above 667 MHz (1333 Mbps). However, these values are programmable and are dependent on the design and sophistication of the printed circuit board routing. Low cost designs with poor impedance and/or trace skew matching may force a lowering of the frequency threshold, and higher quality designs may allow the frequency thresholds to be raised.

The system 100 is initialized in a conventional manner, and the memory interface 110 communicates with the memory device 104 at a low data rate based in part on the clock speed set by the global clock controller 112. Signal termination is not required when data is transmitted at the low data rate, and the controller 108 maintains the switch 148 in the ODT logic 146 of the memory interface 110 and the switch 156 of the ODT logic 154 of the memory die 114 and the switch 164 of the OBT logic 162 in open states. In addition, the controller 108 instructs the power system 120 to provide a reference voltage having a first level from the second regulator 126 to the receiver 140 of the memory interface 110 and to provide a second reference voltage, which may be the same as the first reference voltage, to the receiver 136 of the memory die 114. Because termination is not needed at the memory interface 110 or at the memory die 111 or on the control bus 116, very little power is consumed by the ODT logic 146 or the ODT logic 154 or the OBT logic 162; the controller 108 may optionally cause the power controller 122 to shut down the first regulator 12'4, the fourth regulator 130 and the fifth regulator 132 when signal termination is not required in order to achieve additional power savings.

Various conditions may require a higher data transfer rate between the memory interface 110 and the memory device 104, for example, when the processor 102 begins running a graphics-intensive program. As previously discussed, such a higher data rate requires signal termination for efficient data transfer. This next data rate described herein is referred to herein as a medium rate, and for this rate, signal termination should be provided at both ends of the bidirectional data bus 118. The process of changing the data rate on the bidirectional data bus 118 is described below.

Data transfer on the bidirectional data bus 118 must be halted or stalled during the transition from one data rate to another. Therefore, when the CPU 106 informs the controller 108 that a shift from the low data rate to a medium data rate is needed, the controller 108 causes the memory interface 110 to complete any outstanding transactions with the memory device 104 and then stop sending data over the bidirectional data bus 118. During this time, the memory device 104 enters in a self-refresh mode to preserve its contents. Next, the controller 108 signals the power controller 122 to cause the second regulator 126 to change the first reference voltage provided to the receiver 140 of the memory interface 110 and to cause the third regulator 128 to change the second reference voltage provided to the receiver 136 of the memory die 114. The power supply 120 and the first, through fifth regulators 124-132 therein are configured to change voltage quickly and without producing significant noise because the faster the reference voltages can be changed and stabilized, the faster data traffic can resume on the bidirectional data bus 118.

Figure 2:
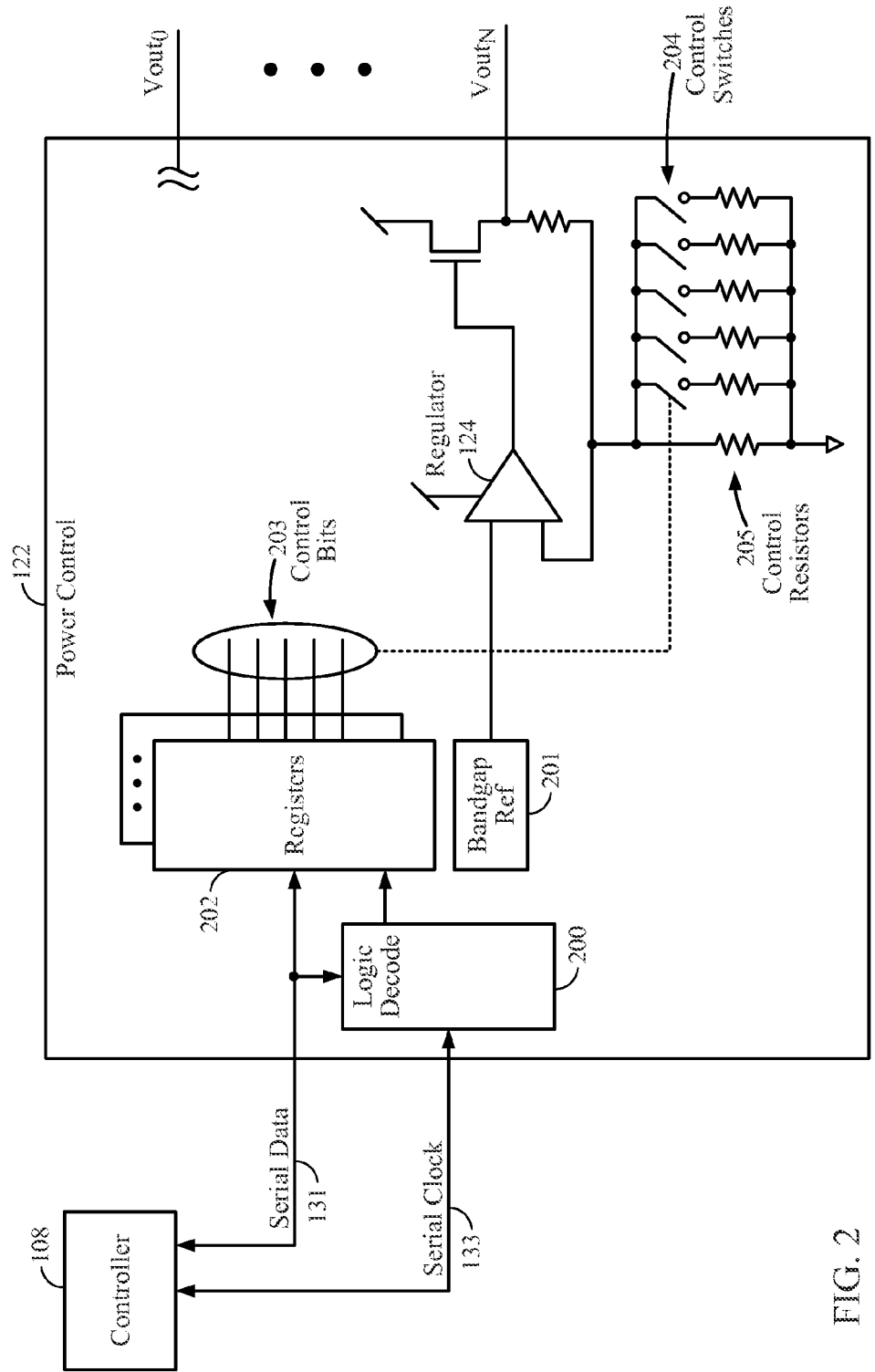
FIG. 2 is a circuit diagram of a portion of a power controller of the system of FIG. 1.

This voltage change may be accomplished, for example, by using suitable circuitry in the power controller 122 as illustrated in FIG. 2. The controller 108 communicates with the power controller 122 via the serial data bus 131 and the serial clock bus 133. Packets (not illustrated) are transmitted that have a command portion, an address portion and a data portion, and this allows the controller 108 to write, read, and control the power controller 122.

FIG. 2 illustrates a portion of the power controller 122 that produces an output from the first regulator 124; similar circuitry controls the outputs of the second through fifth regulators 126, 128, 130, 132 but is not specifically illustrated. Incoming packets from the controller 108 are inspected by the logic decode 200 which determines what type of operation to perform and where to route the data. To change the voltage Vout from the first regulator 124, the packet from the controller 108 writes a binary voltage representation into a corresponding register 202, and the output of the register 202, controls bits 203 to close appropriate ones of control switches 204. This establishes through the control resistors 205 the predetermined Vout for the first regulator 124. The first regulator 124 receives an input from a bandgap reference 201 and a second input from the network of control resistors 205 for establishing an output voltage.

Power controller 122 contains numerous regulators whose voltages can be independently controlled using this scheme. It is also possible for the controller 108 to read information back from the power controller 122, including the control bit 203 values. During a speed switch, numerous voltages in the system 100 may need to be re-programmed quickly, and this simple and efficient interface permits rapid voltage re-programming and reduces overall system time. The termination voltage that is supplied to the various terminations are directly driven by transistor outputs of the first regulator 124 and corresponding transistor outputs (not illustrated) of the second through fifth regulators 126-132. This results in a very low output impedance and correspondingly faster transient response (compared with a traditional resistor voltage divider) which significantly reduces the duration of the bus stall. In addition, when the termination switches 148, 156, 164 are open, there is no current flow through output transistors of the first through fifth regulators 124-132 (compared with static current flow through a traditional resistor voltage divider). Finally, in a system which may need to support multiple DRAM interface standards, the digital re-programmability of all the regulators provides significant flexibility versus traditional resistor voltage divider. For example, DDR3, DDR3L, and DDR4 devices can be supported on identical platforms merely by reprogramming the first through fifth regulators 124-132.

The controller 108 also signals the ODT logic 146 on the memory interface 110 to close the switch 148 to terminate the second data line 144 and signals the ODT logic 154 on the memory die 114 to close the switch 156 and terminate the first data line 138. The power controller 122 must also reactivate the first regulator 124 and the fourth regulator 130 if they were previously powered down for power saving reasons. The clock rate is increased from a low rate to a medium rate, and the system 100 will be ready to resume data transfer once the voltages provided by the power system 120 have stabilized. It takes less time to enable the ODT logic 146, 154 on the memory interface 110 and the memory die 114 than to stabilize the voltages provided by the power system 120. Therefore, programmable timers (not illustrated) may be used to stall data on the bidirectional data bus 118 for a time long enough to ensure a stable voltage supply. Note that this settling time of the voltages is dependent on platform variables such as the number of memory devices that are sourced by a particular voltage regulator, the number of bypassing capacitors used to quiet that voltage supply, and the construction and sophistication of the printed circuit board (PCB). Therefore, the programmable stall time can be optimized for the system components and PCB construction. When those timers expire, the controller 108 causes the memory interface 110 to resume communication with the memory die 114, and the memory die 114 ceases its self-refresh operation. A status register is updated in the global clock control 112, and, if necessary, an interrupt is sent to the CPU 106.

The system 100 continues to operate in this manner until a need for yet a higher data transfer speed arises. In order to switch the data rate on the bidirectional data bus 118 to a high speed, it is also necessary to activate the OBT logic 162 to provide signal termination on the control bus 116. Traffic on the bidirectional data bus 118 is stalled as was the case during the transfer from low to medium data rate, and the reference voltages provided by the second regulator 126 and the third regulator 128 to the memory interface 110 and the memory die 114 are adjusted as necessary. In addition, the controller 108 sends a signal to the OBT logic 162 to cause the OBT logic 162 to close the switch 164 and terminate the signal on the control bus 116. If the fifth regulator 132 is in an inactive state, this fifth regulator 132 is reactivated at this time as well. Once the voltages provided by the power supply 120 have stabilized, control data traffic resumes on the control bus 116 and data traffic resumes on the bidirectional data bus 118. These same steps are followed in order to reduce the data rate on the bidirectional data bus 118 to the medium or low level, namely, stalling traffic on the respective bus, disabling the ODT and OBT, and changing the reference voltages provided to the receiver 140 on the memory interface 110 and the receiver 136 at the memory die 114. Of course, the system 100 can also transition directly from the low rate condition to the high rate condition by enabling the OBT logic 162 at the same time as the ODT logic 146 of the memory interface 110 and the ODT logic 154 of the memory die 114. These transitions are under the control of the CPU 106 and the controller 108 based on the data transfer rates required by the system 100 and components (not illustrated) connected thereto.

The system 100 described above beneficially places the control of signal termination at various locations under the control of controller 108 in a manner that allows for the dynamic control of signal termination at multiple locations in the system 100. In addition, because the controller 108 also controls the reference voltages provided to the memory interface 110 and the memory die 114 and stops and starts the transmission of data on the bidirectional data bus 118 and on the control bus 116, the controller 108 can coordinate the stopping of data on the bidirectional data bus 118 and on the control bus 116 with the changes in signal termination and reference voltages in a manner that reduces the time that the bidirectional data bus 118 is unavailable for use by the system 100 and thus obtain energy savings while maintaining acceptable system performance. Additional flexibility is provided by using one platform to handle variations in memory interface standards, bus topology/component population, and PCB construction and routing.

Figure 3:
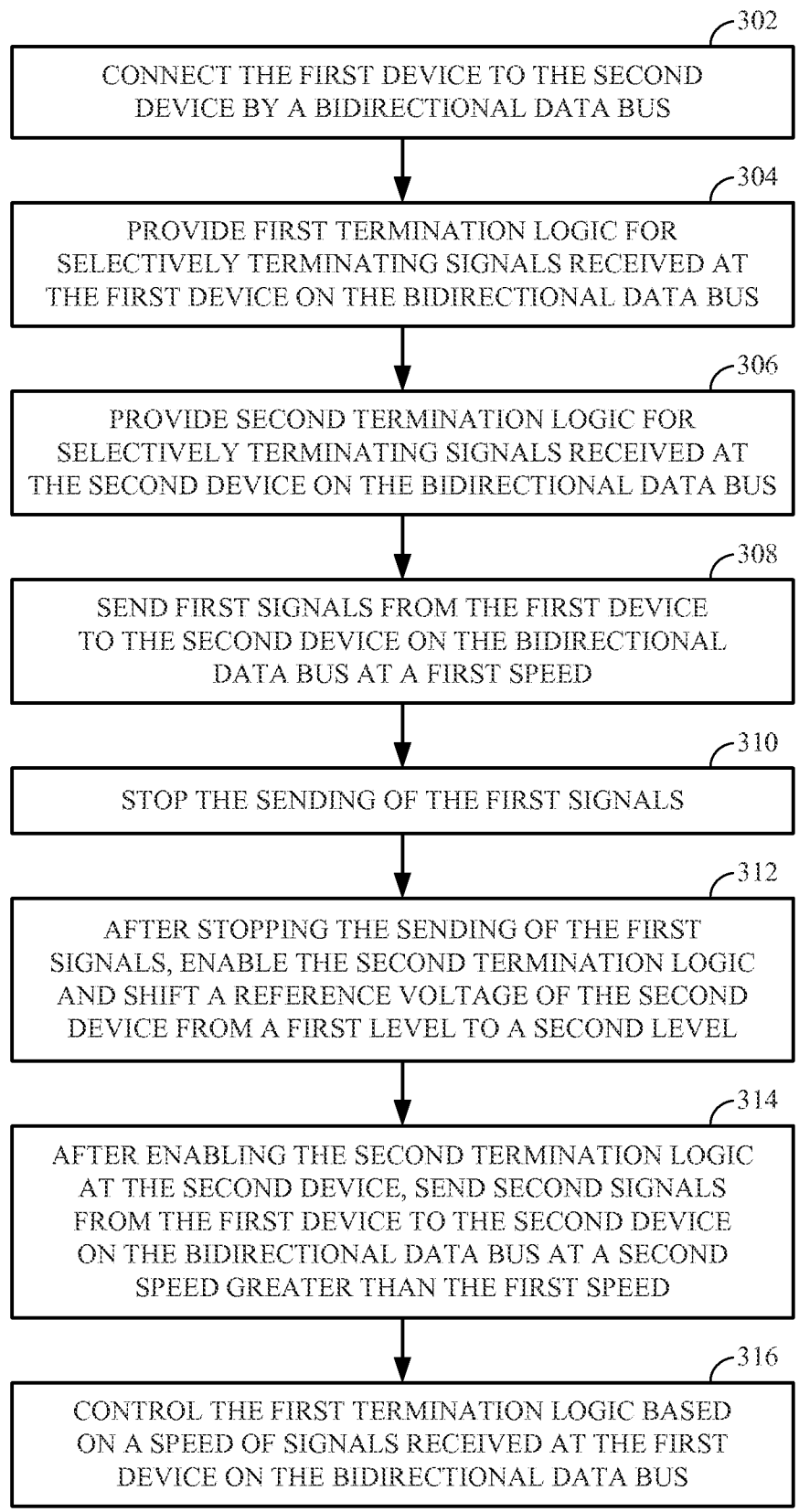
FIG. 3 is a flow chart illustrating a method according to the disclosure.

FIG. 3 illustrates a method according to an embodiment of the disclosure that includes a block 302 of connecting the first device to the second device by a bidirectional data bus, a block 304 of providing first termination logic for selectively terminating signals received at the first device on the bidirectional data bus, and a block 306 of providing second termination logic for selectively terminating signals received at the second device on the bidirectional data bus. The method also includes a block 308 of sending first signals from the first device to the second device on the bidirectional data bus at a first speed, a block 310 of stopping the sending of the first signals, and a block 312 of, after stopping the sending of the first signals, enabling the second termination logic and shilling a reference voltage of the second device from a first level to a second level. In addition, the method includes a block 314 of, after enabling the second termination logic at the second device, sending second signals from the first device to the second device on the bidirectional data bus at a second speed, greater than the first speed, and a block 316 of controlling the first termination logic based on a speed of signals received at the first device on the bidirectional data bus.

Figure 4:
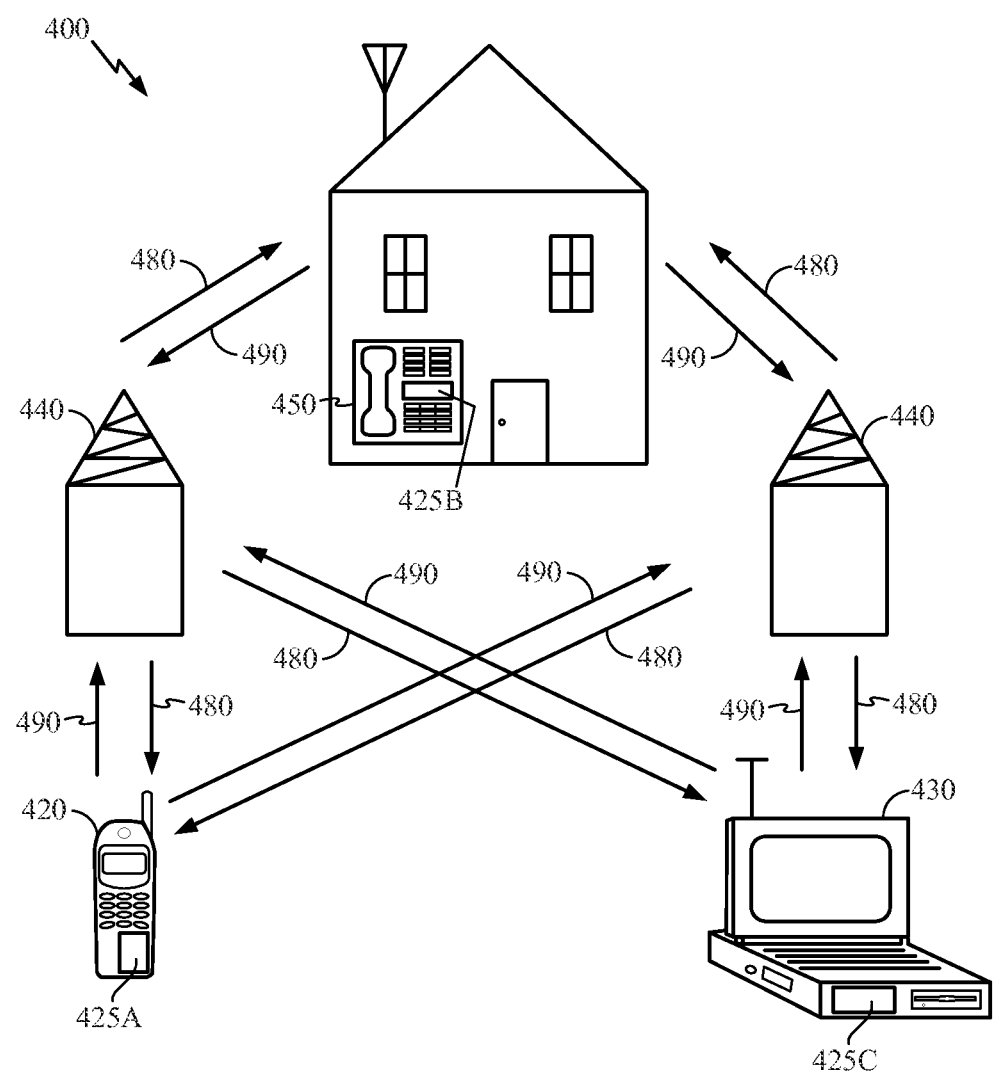
FIG. 4 is a schematic diagram of an exemplary wireless communication system in which embodiments of the disclosure may be used.

FIG. 4 illustrates an exemplary wireless communication system 400 in which one or more embodiments of the disclosure may be advantageously employed. For purposes of illustration, FIG. 4 shows three remote units 420, 430, and 450 and two base stations 440. It will be recognized that conventional wireless communication systems may have many more remote units and base stations. The remote units 420, 430, and 450 include integrated circuit or other semiconductor devices 425A, 425B and 425C (including a system as disclosed herein), which are among embodiments of the disclosure as discussed further below. FIG. 4 shows forward link signals 480 from the base stations 440 and the remote units 420, 430, and 450 and reverse link signals 490 from the remote units 420, 430, and 450 to the base stations 440.

In FIG. 4, the remote unit 420 is shown as a mobile telephone, the remote unit 430 is shown as a portable computer, and the remote unit 450 is shown as a fixed location remote unit in a wireless local loop system. For example, the remote units may be any or combination of a mobile phone, handheld personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 4 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for causing a controller to selectively control on-die and/or on-board signal termination based on the speed of data on a line being terminated. Accordingly, the invention is not limited to illustrated examples and any means for performing the functionality described herein are included in embodiments of the invention.

While the foregoing disclosure shows illustrative embodiments of the invention, it should he noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of controlling signal termination on at least one bus connecting a first device to a second device, the method comprising:
    connecting the first device to the second device by a bidirectional data bus;
    providing a first termination logic for selectively terminating signals received at the first device on the bidirectional data bus;
    providing a second termination logic for selectively terminating signals received at the second device on the bidirectional data bus;
    sending first signals from the first device to the second device on the bidirectional data bus at a first speed;
    stopping the sending of the first signals;
    after stopping the sending of the first signals, enabling the second termination logic and shifting a reference voltage of the second device from a first level to a second level;
    after enabling the second termination logic at the second device, sending second signals from the first device to the second device on the bidirectional data bus at a second speed, greater than the first speed; and
    controlling the first termination logic based on a speed of signals received at the first device on the bidirectional data bus.

2. The method of claim 1, wherein the first device includes a memory controller and the second device is a memory device.

3. The method of claim 2, further comprising connecting the first device to the second device by a control bus.

4. The method of claim 3, further comprising providing a third termination logic or selectively terminating signals received at the memory device on the control bus.

5. The method of claim 4, wherein the first termination logic comprises a first on-die termination (ODT) logic on the memory controller, the second termination logic comprises a second ODT logic at the memory device and the third termination logic comprise an on-board termination (OBT) logic.

6. The method of claim 4, further comprising providing a controller and controlling the first termination logic and the second termination logic and the third termination logic using the controller.

7. The method of claim 4, wherein the first termination logic comprises a first ODT logic on the memory -controller, the second termination logic comprises a second ODT logic at the memory device and the third termination logic comprise an OBT logic, and
    wherein the first ODT logic includes a resistor and a switch for connecting the resistor to a voltage source, the method including disabling the voltage source when the signals received at the first device on the bidirectional data bus are not terminated.

8. The method of claim 1 further comprising:
    stopping the sending of the second signals;
    after stopping the sending of the second signals, disabling the second termination logic at the second device and shifting the reference voltage of the second device from the second level to the first level; and after disabling the second termination logic at the second device, sending the first signals from the first device to the second device at the first speed.

9. The method of claim 1, further comprising providing a controller and controlling the first termination logic and the second termination logic using the controller, wherein controlling the first termination logic comprises writing a binary voltage representation into a register.

10. The method of claim 1, wherein the first termination logic includes a resistor and a switch for connecting the resistor to a voltage source, the method including disabling the voltage source when the signals received at the first device on the bidirectional data bus are not terminated.

11. The method of claim 1 wherein enabling the second termination logic comprises sending a first control signal from the first device to the second device.

12. The method of claim 1, wherein the first device comprises a memory controller and the second device is a dynamic random access memory (DRAM) device.

13. The method of claim 1,
wherein the first device comprises a memory controller and the second device is a memory device,
wherein the first termination logic comprises a first ODT logic on a memory interface, and the second termination logic comprises a second ODT logic at the memory device, and
wherein enabling the second termination logic comprises sending a first control signal from the memory interface to the second ODT logic.

14. A system comprising:
a memory interface;
a memory device connected to the memory interface by a control bus and a bidirectional data bus;
a first termination logic for selectively terminating signals received at the memory interface on the bidirectional data bus;
a second termination logic for selectively terminating signals received at the memory device on the bidirectional data bus;
a third termination logic for selectively terminating signals received at the memory device on the control bus;
a reference voltage generator for providing a first reference voltage to the memory interface and for providing a second reference voltage to the memory device; and
a controller for selectively enabling the first termination logic and the second termination logic and the third termination logic and for controlling the first reference voltage and the second reference voltage and for controlling data transmission between the memory interface and the memory device on the bidirectional data bus,
wherein the controller is configured to selectively enable the first termination logic based on a speed of signals received at the memory interface on the bidirectional data bus and to selectively enable the second termination logic based on a speed of signals received at the memory device on the bidirectional data bus and to selectively enable the third termination logic based on a speed of signals received at the memory device on the control bus and to cause the reference voltage generator to provide the first reference voltage to the memory interface when the first termination logic is enabled and to provide a second reference voltage different than the first reference voltage to the memory interface when the first termination logic is not enabled and to provide a third reference voltage to the memory device when the third termination logic is enabled and to provide a fourth reference voltage different than the third reference voltage to the memory device when the third termination logic is not enabled and to stop traffic on the bidirectional data bus before enabling or disabling the first termination logic and before enabling or disabling the second termination logic.

15. The system of claim 14, wherein the first termination logic comprises a first ODT logic on the memory interface, wherein the second termination logic comprises a second ODT logic on the memory device and wherein the third termination logic comprises a third OBT logic.

16. The system of claim 14, wherein the controller controls the speed of signals received at the memory device on the bidirectional data bus.

17. The system of claim 14, wherein the reference voltage generator comprises an active buffer with a high impedance ladder.

18. The system of claim 14, wherein the controller and the memory interface are integrated into a processor.

19. The system of claim 14 integrated into at least one semiconductor die.

20. The system of claim 14, wherein the system is integrated into one of a set top box, a music player, a video player, an entertainment unit, a navigation device, a communications device, a personal digital assistant (PDA), a fixed location data unit, and a computer.

21. A system comprising:
a bidirectional data bus connecting a first device to a second device;
first termination means for selectively terminating signals received at the first device on the bidirectional data bus;
second termination means for selectively terminating signals received at the second device on the bidirectional data bus;
means for sending first signals from the first device to the second device on the bidirectional data bus at a first speed;
means for stopping the sending of the first signals;
means for enabling the second termination means and shifting a reference voltage of the second device from a first level to a second level after stopping the sending of the first signals;
means for sending second signals from the first device to the second device on the bidirectional data bus at a second speed, greater than the first speed, after enabling the second termination means at the second device; and
means for controlling the first termination means based on a speed of signals received at the first device on the bidirectional data bus.

22. The system of claim 21, further comprising providing third termination means for selectively terminating signals received at the second device on a control bus.

23. The system of claim 21, further comprising:
means for stopping the sending of the second signals;
means for disabling the second termination means and shifting the reference voltage of the second device from the second level to the first level after stopping the sending of the second signals; and
means for sending the first signals from the first device to the second device at the first speed after disabling the second termination means.

24. A method of controlling signal termination on at least one bus connecting a first device to a second device, the method comprising:
steps for connecting the first device to the second device by a bidirectional data bus;

steps for providing first termination logic for selectively terminating signals received at the first device on the bidirectional data bus;

steps for providing second termination logic for selectively terminating signals received at the second device on the bidirectional data bus;

steps for sending first signals from the first device to the second device on the bidirectional data bus at a first speed;

steps for stopping the sending of the first signals;

after stopping the sending of the first signals, steps for enabling the second termination logic and shifting a reference voltage of the second device from a first level to a second level;

after enabling the second termination logic at the second device, steps for sending second signals from the first device to the second device on the bidirectional data bus at a second speed, greater than the first speed; and steps for controlling the first termination logic based on a speed of signals received at the first device on the bidirectional data bus.

25. The method of claim 24, further comprising selectively terminating signals received at the second device on a control bus.

26. The method of claim 24, further comprising:

steps for stopping the sending of the second signals;

steps for disabling the second termination logic and shifting the reference voltage of the second device from the second level to the first level after stopping the sending of the second signals; and steps for sending the first signals from the first device to the second device at the first speed after disabling the second termination logic at the second device.

27. A non-transitory computer readable medium embodying instructions that when executed by a computer cause the computer to control signal terminations on at least one bus connecting a first device to a second device by:

selectively terminating signals received at the first device on a bidirectional data bus;

selectively terminating signals received at the second device on the bidirectional data bus;

causing the first device to send first signals from the first device to the second device on the bidirectional data bus at a first speed;

causing the first device to stop the sending of the first signals;

after causing the first device to stop the sending of the first signals, shifting a reference voltage of the second device from a first level to a second level;

after enabling a second termination logic at the second device, causing the first device to send signals from the first device to the second device on the bidirectional data bus at a second speed, greater than the first speed; and controlling a first termination logic based on a speed of signals received at the first device on the bidirectional data bus.

* * * * *